US012721196B2

(12) United States Patent
Sakamoto

(10) Patent No.: US 12,721,196 B2
(45) Date of Patent: Aug. 25, 2026

(54) SEMICONDUCTOR DEVICE WITH DETECTION ELECTRODE

(71) Applicant: ROHM CO., LTD., Kyoto (JP)

(72) Inventor: Tadayuki Sakamoto, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 421 days.

(21) Appl. No.: 18/538,771

(22) Filed: Dec. 13, 2023

(65) Prior Publication Data

US 2024/0203861 A1 Jun. 20, 2024

(30) Foreign Application Priority Data

Dec. 15, 2022 (JP) ................................ 2022-200418

(51) Int. Cl.
*H10W 70/65* (2026.01)
*H10W 90/00* (2026.01)

(52) U.S. Cl.
CPC ......... *H10W 70/65* (2026.01); *H10W 90/701* (2026.01)

(58) Field of Classification Search
CPC ... H10W 70/65; H10W 90/701; H10W 72/50; H10W 72/90
See application file for complete search history.

(56) References Cited

U.S. PATENT DOCUMENTS

2013/0284572 A1* 10/2013 Teh ....................... B81B 3/0021 200/283
2020/0266134 A1* 8/2020 Kanda ................. H10W 70/468

FOREIGN PATENT DOCUMENTS

JP 2022-63971 A 4/2022

* cited by examiner

*Primary Examiner* — Changhyun Yi
(74) *Attorney, Agent, or Firm* — HSML P. C.

(57) ABSTRACT

The present disclosure provides a semiconductor device. The semiconductor device includes: a semiconductor element having multiple electrodes; and a support body, in which the electrodes are bonded by multiple conductive bonding materials. The support body includes a first conductive portion and a second conductive portion. The electrodes include first to fourth electrodes, a first detection electrode and a second detection electrode. The semiconductor element further includes first to third wirings. A conduction path is configured to sequentially include the first wiring, the first electrode, the first conductive portion, the second electrode, the second wiring, the third electrode, the second conductive portion, the fourth electrode and the third wiring between the first detection electrode and the second detection electrode.

20 Claims, 10 Drawing Sheets

A1
44
4
10
1
3
41
12
11
21
23
22
2
24
91
8

SEMICONDUCTOR DEVICE WITH DETECTION ELECTRODE

TECHNICAL FIELD

The present disclosure relates to a semiconductor device.

BACKGROUND

There are various available semiconductor devices having semiconductor elements flip-chip mounted on support bodies in the industry. Patent document 1 discloses an example of such conventional semiconductor device. The semiconductor device disclosed in the patent document is flip-chip mounted with a semiconductor element on a support body formed by multiple conductive wires by using multiple solders. The multiple solders conductively connect multiple electrodes of the semiconductor element with the multiple conductive wires.

PRIOR ART DOCUMENT

Patent Publication

[Patent document 1] Japan Patent Publication No. 2022-63971

DETAILED DESCRIPTION OF THE EMBODIMENTS

Details of the preferred embodiments of the present disclosure are provided with the accompanying drawings below.

The terms "first", "second" and "third" used in the present disclosure are for identification purposes, and are not construed as assigning order to the targets.

In the present disclosure, expressions "an object A formed at an object B" and "an object A formed on/over an object B" include "an object A directly formed at an object B", and "another object placed between an object A and an object B, and the object A formed at the object B", unless otherwise specified. Similarly, expressions "an object A arranged at an object B" and "an object A arranged on/over an object B" include "an object A directly arranged at an object B", and "another object placed between an object A and an object B, and the object A arranged at the object B", unless otherwise specified. Similarly, an expression "an object A located on an object B" includes "an object A in contact with an object B and the object A located on the object B", and "another object placed between an object A and an object B, and the object A located on the object B", unless otherwise specified. Moreover, an expression "an object A overlapping an object B when observed in a direction" includes "an object A completely overlapping an object B" and "an object A partially overlapping an object B", unless otherwise specified. Moreover, in the present disclosure, an expression "a surface A facing (one side or the other side of) a direction B" is not limited to being a situation where the surface A being at 90° relative to the direction B, but also includes a situation where the surface A is tilted relative to the direction B.

First Embodiment

Figure 1:
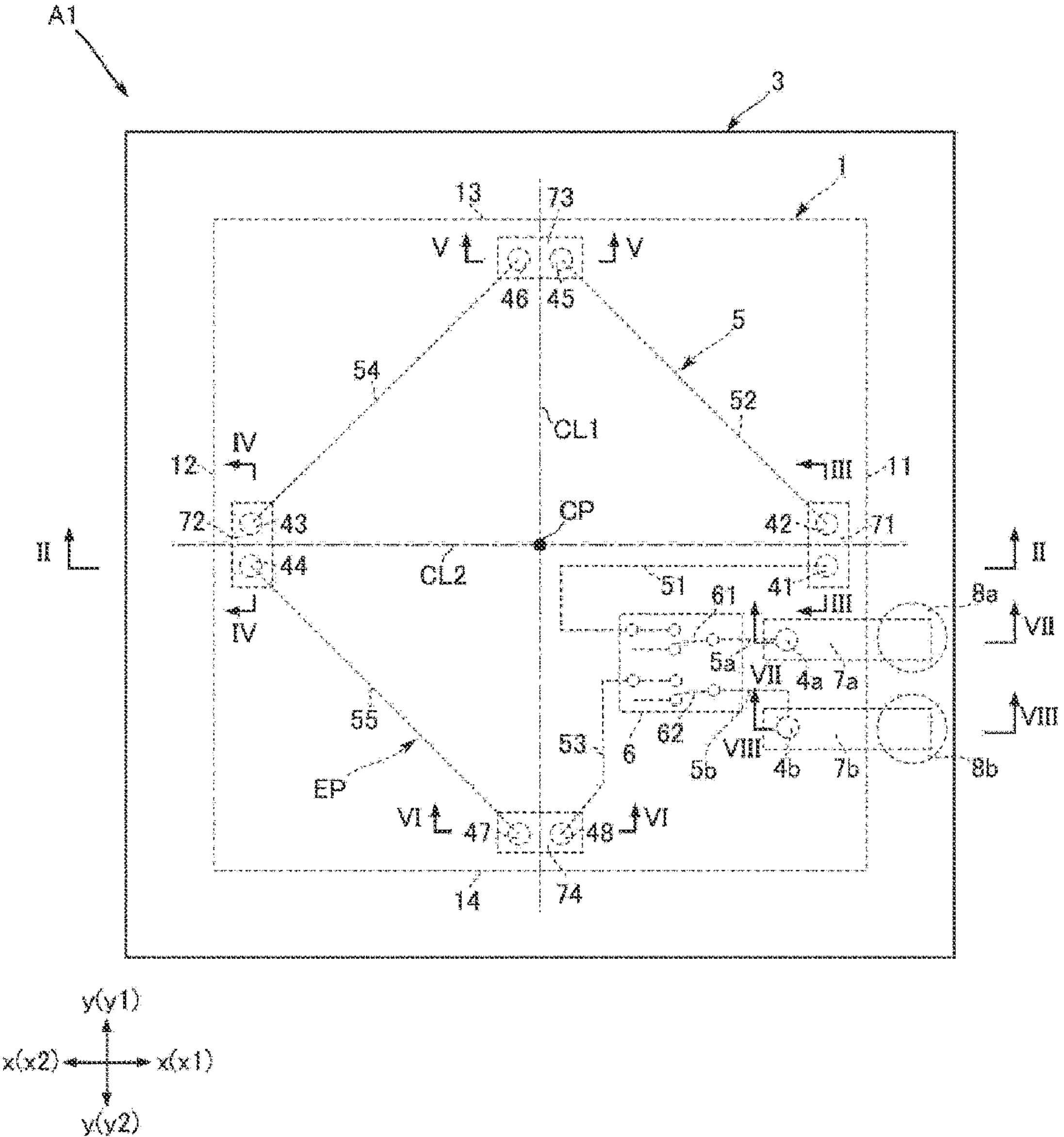
FIG. 1 is a plan view of a semiconductor device according to a first embodiment of the present disclosure.
Figures 2, 3:
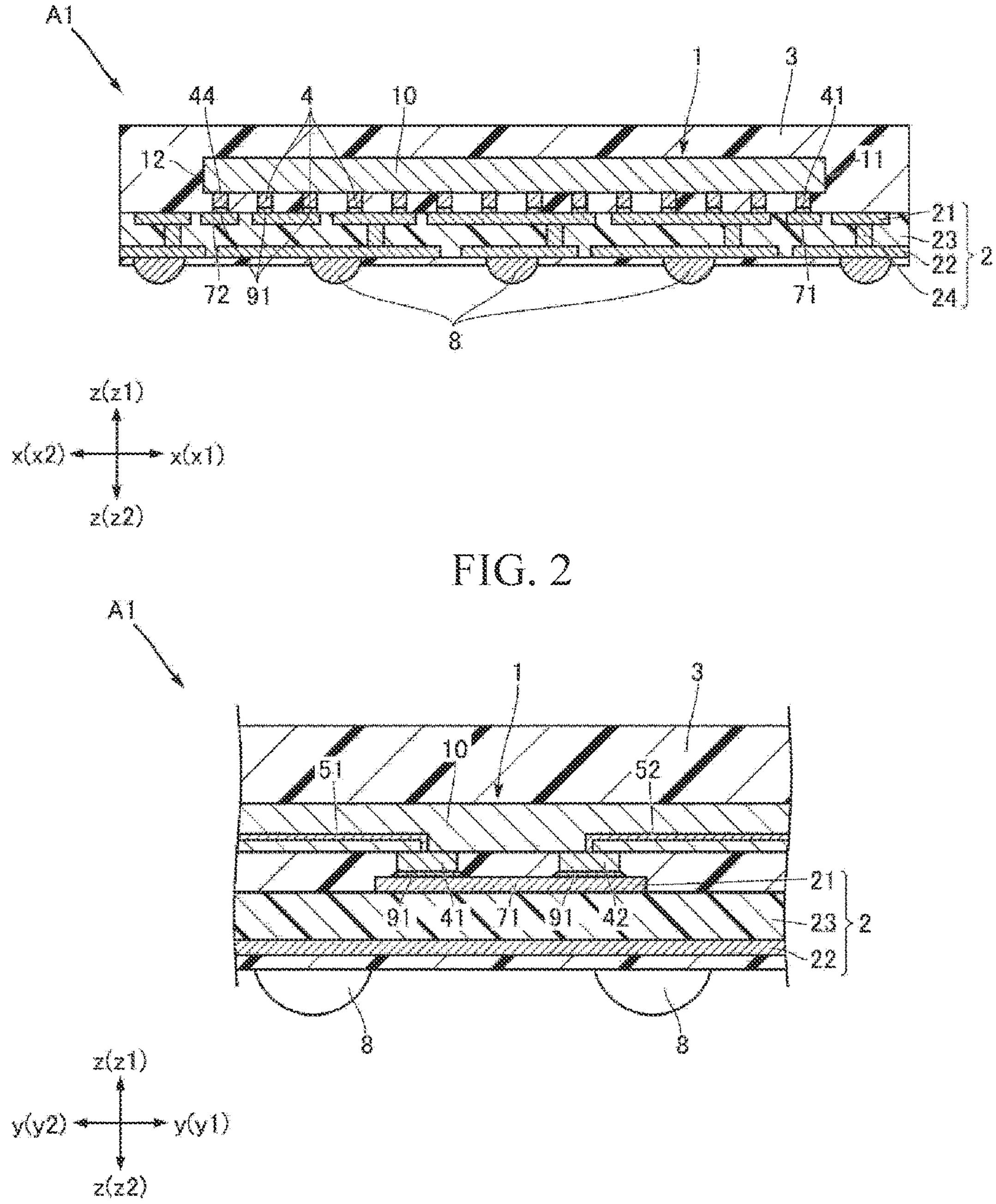
FIG. 2 is a cross-sectional view along a section line II-II in FIG. 1.
FIG. 3 is a partial enlarged cross-sectional view along a section line III-III in FIG. 1.
Figures 4, 5:
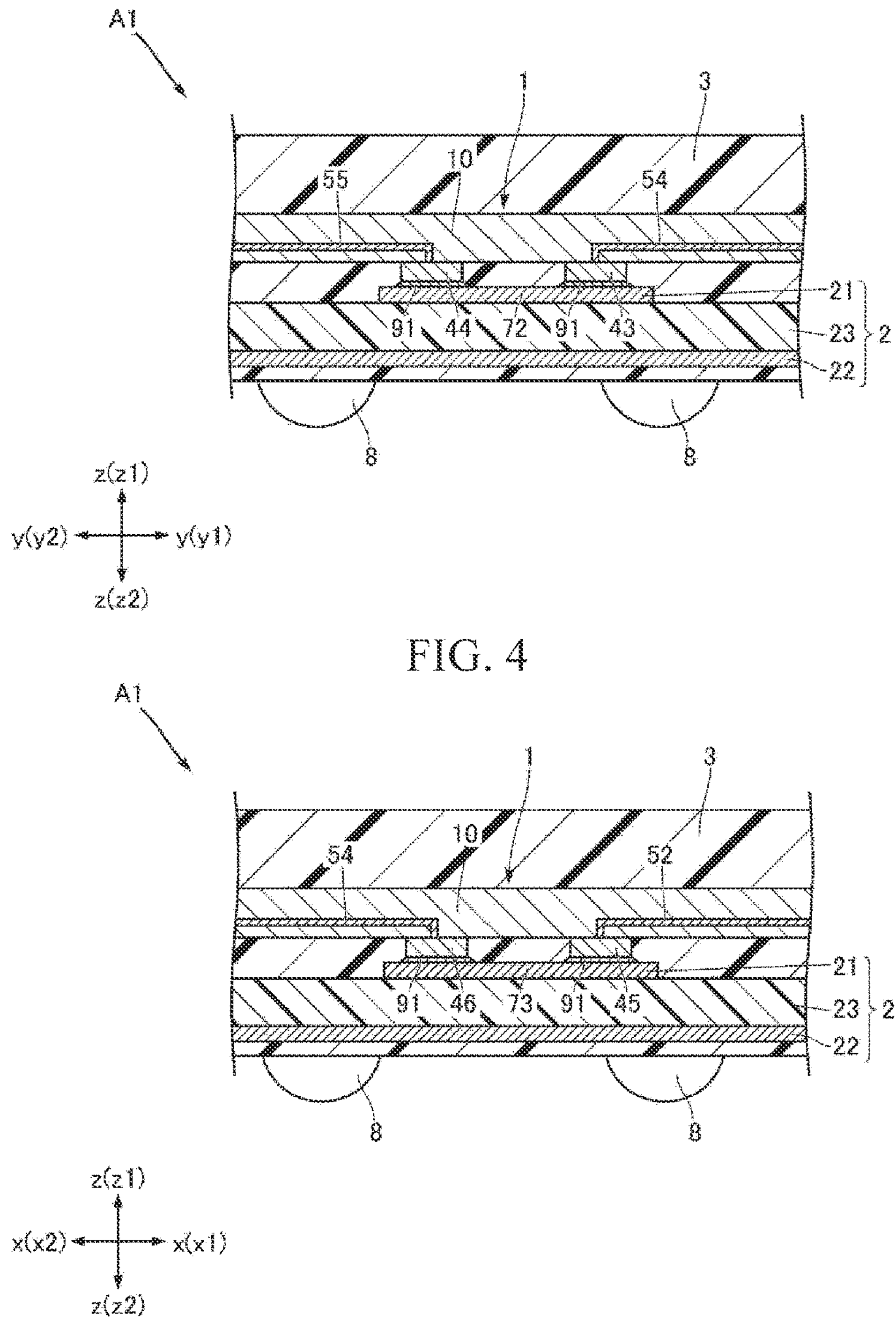
FIG. 4 is a partial enlarged cross-sectional view along a section line IV-IV in FIG. 1.
FIG. 5 is a partial enlarged cross-sectional view along a section line V-V in FIG. 1.
Figures 6, 7:
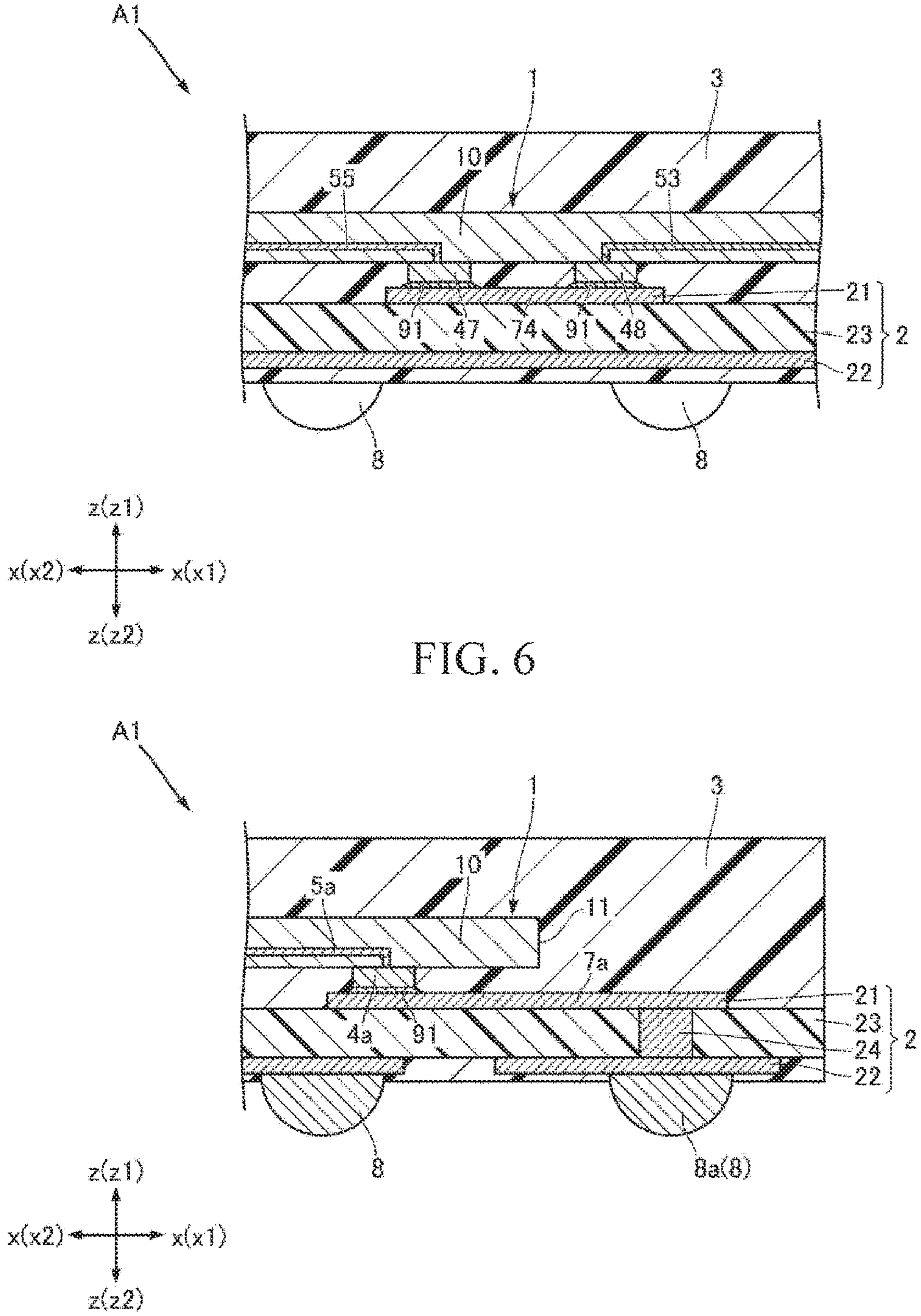
FIG. 6 is a partial enlarged cross-sectional view along a section line VI-VI in FIG. 1.
FIG. 7 is a partial enlarged cross-sectional view along a section line VII-VII in FIG. 1.
Figure 8:
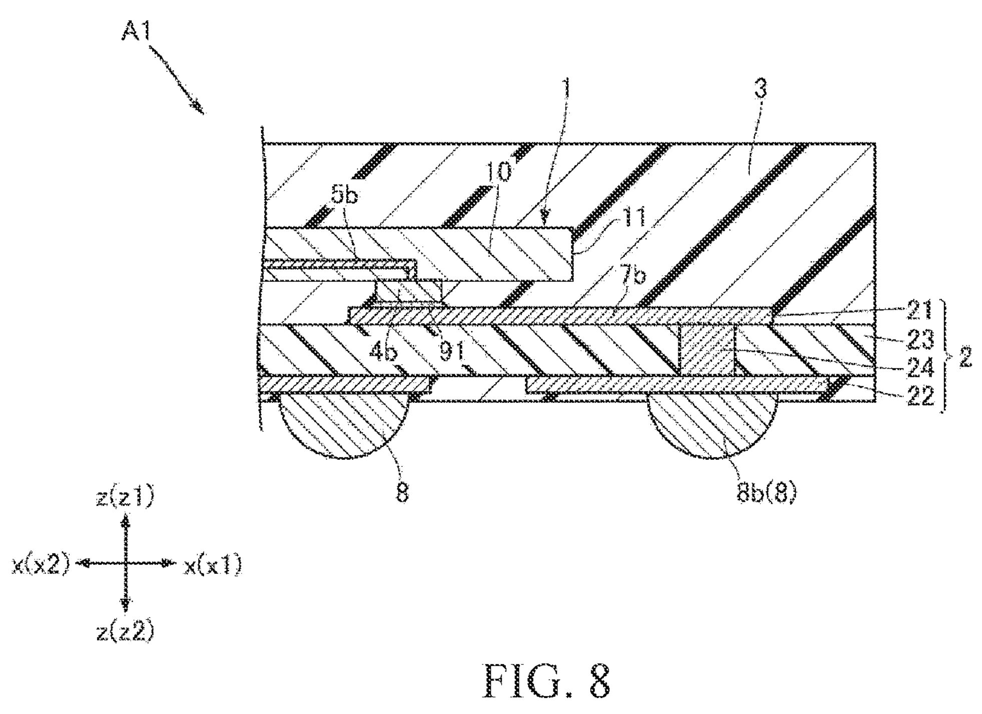
FIG. 8 is a partial enlarged cross-sectional view along a section line VIII-VIII in FIG. 1.
Figure 9:
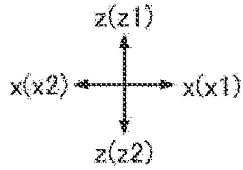
FIG. 9 is a cross-cross-sectional view taken along the section line II-II in FIG. 1 when a semiconductor element is tilted.

FIG. 1 to FIG. 9 show diagrams of a semiconductor device according to a first embodiment of the present disclosure. A semiconductor device A1 of this embodiment includes a semiconductor element 1, a support body 2, and a sealing resin 3. FIG. 1 shows a plan view of the semiconductor device A1. FIG. 2 shows a cross-sectional view along a section line II-II in FIG. 1. FIG. 3 shows a partial enlarged cross-sectional view along a section line III-III in FIG. 1. FIG. 4 shows a partial enlarged cross-sectional view along a section line IV-IV in FIG. 1. FIG. 5 shows a partial enlarged cross-sectional view along a section line V-V in FIG. 1. FIG. 6 shows a partial enlarged cross-sectional view along a section line VI-VI in FIG. 1. FIG. 7 shows a partial enlarged cross-sectional view along a section line VII-VII in FIG. 1. FIG. 8 shows a partial enlarged cross-sectional view along a section line VIII-VIII in FIG. 1. FIG. 9 shows a cross-sectional view along the section line II-II in FIG. 1 when a semiconductor element is tilted.

In these drawings, a thickness direction of the support body 2 is defined as the z direction. A first side in the z direction is referred to as a side z1, and a second side in the z direction opposite to the first side is referred to a side z2. Moreover, a direction perpendicular to the z direction is defined as the x direction. A first side in the x direction is referred to as a side x1, and a second side in the x direction opposite to the side x1 is referred to a side x2. Moreover, a direction perpendicular to the z direction and the x direction is defined as the y direction. A first side in the y direction is referred to as a side y1, and a second side in the y direction opposite to the side y1 is referred to a side y2.

[Support Body 2]

The support body 2 supports the semiconductor element 1. On the support body 2, the semiconductor element 1 is conductively connected by multiple conductive bonding materials 91. The conductive bonding material 91 is, for example, a solder. The configuration of the support body 2 is not specifically defined. The support body 2 can be various substrates, or can be formed by multiple metal conductive wires. In this embodiment, the support body 2 is configured as a substrate including a first conductive layer 21, a second conductive layer 22, an insulating layer 23, multiple through conductive portions 24 and multiple external electrodes 8. Such semiconductor device A1 is not specifically defined, and can be, for example, referred to as a ball grid array (BGA) package structure, or can be various package structures primarily adopting a land grid array (LGA). The shape of the support body 2 is not specifically defined, and the support body 2 has a rectangular shape when observed in the z direction in the example shown in the drawings.

The first conductive layer 21 is a layer located on the side z1 in the z direction. The first conductive layer 21 is, for example, formed of copper (Cu) as a main component, and is formed by, for example, plating.

The second conductive layer 22 is a layer located on the side z2 in the z direction. The second conductive layer 22 is, for example, formed of copper as a main component, and is formed by, for example, plating. In addition, an insulating layer covering the second conductive layer 22 on the side z2 in the z direction can also be provided.

The insulating layer 23 is sandwiched between the first conductive layer 21 and the second conductive layer 22 in the z direction. The insulating layer 23 is formed of an insulation material such as a resin.

The multiple through conductive portions 24 individually pass through the insulating layer 23 in the z direction. The multiple through conductive portions 24 are formed of copper as a main component. The multiple through conductive portions 24 individually conduct multiple appropriate parts of the first conductive layer 21 with multiple appropriate parts of the second conductive layer 22.

The multiple external electrodes 8 are disposed on the side z2 in the z direction relative to the second conductive layer 22. The multiple external electrodes 8 are arranged in a matrix, for example, and are individually conducted with the appropriate parts of the second conductive layer 22. The external electrodes 8 are formed of a metal, for example, by semi-spherical solders.

The support body 2 includes a first conductive portion 71, a second conductive portion 72, a third conductive portion 73, a fourth conductive portion 74, a first detection conductive portion **7*a* and a second detection conductive portion 7*b*. In this embodiment, each of the first conductive portion 71, the second conductive portion 72, the third conductive portion 73, the fourth conductive portion 74, the first detection conductive portion 7*a* and the second detection conductive portion 7*b* is formed by a part of the first conductive layer 21**.

The first conductive portion 71 is located on the side x1 in the x direction. The first conductive portion 71 is not defined with a specific shape, and has a rectangular shape in the example shown in the drawings. The second conductive portion 72 is located on the side x2 in the x direction. The second conductive portion 72 is not defined with a specific shape, and has a rectangular shape in the example shown in the drawings. The first conductive portion 71 and the second conductive portion 72 are arranged on opposite sides of a first central line CL1. The first central line CL1 is a central line passing through a center CP of the semiconductor element 1 and extending along the y direction. In this embodiment, the y direction is equivalent to a first direction. Moreover, in the example shown in the drawings, the first conductive portion 71 and the second conductive portion 72 intersect a second central line CL2. The second central line CL2 is a central line passing through the center CP and extending along the x direction. In this embodiment, the x direction is equivalent to a second direction.

The third conductive portion 73 is located on the side y1 in the y direction. The third conductive portion 73 is not defined with a specific shape, and has a rectangular shape in the example shown in the drawings. The fourth conductive portion 74 is located on the side y2 in the y direction. The fourth conductive portion 74 is not defined with a specific shape, and has a rectangular shape in the example shown in the drawings. The third conductive portion 73 and the fourth conductive portion 74 are arranged on opposite sides of the second central line CL2. Moreover, in the example shown in the drawings, the third conductive portion 73 and the fourth conductive portion 74 intersect the first central line CL1.

The third conductive portion 73 and the fourth conductive portion 74 are located between the first conductive portion 71 and the second conductive portion 72 in the x direction. In addition, the first conductive portion 71 and the second conductive portion 72 are located between the third conductive portion 73 and the fourth conductive portion 74 in the y direction.

The first detection conductive portion **7*a* and the second detection conductive portion 7*b* are located away from the first conductive portion 71, the second conductive portion 72, the third conductive portion 73 and the fourth conductive portion 74. The first detection conductive portion 7*a* and the second detection conductive portion 7*b* are adjacent. In this embodiment, the first detection conductive portion 7*a* and the second detection conductive portion 7*b* are disposed on the side x1 in the x direction. Moreover, the first detection conductive portion 7*a* and the second detection conductive portion 7*b* are disposed on the side y1 in the y direction relative to the first conductive portion 71. The first detection conductive portion 7*a* and the second detection conductive portion 7*b* are not defined with specific shapes, and have rectangular shapes extending along the x direction in the example shown in the drawings. Moreover, the first detection conductive portion 7*a* and the second detection conductive portion 7*b* extend from the semiconductor element 1 toward the side x1** in the x direction when observed in the z direction.

The multiple external electrodes 8 include a first external electrode **8*a* and a second external electrode 8*b*. The first external electrode 8*a* is conducted with the first detection conductive portion 7*a* via the second conductive layer 22 and the through conductive portion 24. The second external electrode 8*b* is conducted with the second detection conductive portion 7*b* via the second conductive layer 22 and the through conductive portion 24**.

[Semiconductor Element 1]

The semiconductor element 1 is a main element that practices electrical functions of the semiconductor device A1. The type, size, specific configuration and function of the semiconductor element 1 are not defined. The semiconductor element 1 of this embodiment includes an element body 10, multiple electrodes 4, a wiring 5, and a switch unit 6. The semiconductor element 1 is flip-chip mounted on the support body 2.

The element body 10 is a part forming a body of the semiconductor element 1. The element body 10 is, for example, a semiconductor including such as silicon (Si). The element body 10 includes, for example, a functional part (omitted from the drawings) mounted with an integrated circuit. In this embodiment, the element body 10 has a rectangular shape when observed in the z direction. The element body 10 includes a first side 11, a second side 12, a third side 13 and a fourth side 14.

The first side 11 and the second side 12 are away from each other in the x direction. The first side 11 and the second side 12 are in parallel with each other along the y direction. The third side 13 and the fourth side 14 are away from each other in the y direction. The third side 13 and the fourth side 14 are in parallel with each other along the x direction.

The multiple electrodes 4 are disposed on the side z2 of the element body 10 in the z direction. The multiple electrodes 4 are, for example, arranged in a matrix along the x direction and the y direction. The multiple electrodes 4 are, for example, appropriately conducted with the functional part. The electrodes 4 are not defined to have a specific configuration, and have a metal such as copper as a main component. Moreover, in the example shown in the drawings, the electrodes 4 are configured to be columns with the z direction as a height direction. Moreover, a metal layer including such as nickel (Ni) or titanium (Ti) can also be appropriately disposed on surfaces of the electrodes 4.

In this embodiment, the multiple electrodes 4 include a first electrode 41, a second electrode 42, a third electrode 43, a fourth electrode 44, a fifth electrode 45, a sixth electrode 46, a seventh electrode 47, an eighth electrode 48, a first detection electrode 4*a* and a second detection electrode 4*b*.

The first electrode 41 and the second electrode 42 are conductively connected to the first conductive portion 71 via the conductive bonding material 91. The first electrode 41 and the second electrode 42 are located on the side x1 in the x direction. The first electrode 41 and the second electrode 42 are arranged in the y direction. In the example shown in the drawings, the first electrode 41 and the second electrode 42 are arranged along the first side 11. In addition, the expression that the first electrode 41 and the second electrode 42 are arranged along the first side 11 refers to that, the first electrode 41 and the second electrode 42 are arranged in the y direction which is an extension direction of the first side 11, without disposing any other electrode 4 between the first electrode 41 and the first side 11 and between the second electrode 42 and the first side 11, and the same applies to the description below.

The third electrode 43 and the fourth electrode 44 are conductively connected to the second conductive portion 72 via the conductive bonding material 91. The third electrode 43 and the fourth electrode 44 are located on the side x2 in the x direction. The third electrode 43 and the fourth electrode 44 are arranged in the y direction. In the example shown in the drawings, the third electrode 43 and the fourth electrode 44 are arranged along the second side 12. The first electrode 41 and the second electrode 42, and the third electrode 43 and the fourth electrode 44 are arranged on opposite sides of the first central line CL1 from each other.

The fifth electrode 45 and the sixth electrode 46 are conductively connected to the third conductive portion 73 via the conductive bonding material 91. The fifth electrode 45 and the sixth electrode 46 are located on the side y1 in the y direction. The fifth electrode 45 and the sixth electrode 46 are arranged in the x direction. In the example shown in the drawings, the fifth electrode 45 and the sixth electrode 46 are arranged along the third side 13.

The seventh electrode 47 and the eighth electrode 48 are conductively connected to the fourth conductive portion 74 via the conductive bonding material 91. The seventh electrode 47 and the eighth electrode 48 are located on the side y2 in the y direction. The seventh electrode 47 and the eighth electrode 48 are arranged in the x direction. In the example shown in the drawings, the seventh electrode 47 and the eighth electrode 48 are arranged along the fourth side 14. The fifth electrode 45 and the sixth electrode 46, and the seventh electrode 47 and the eighth electrode 48 are arranged on opposite sides of the second central line CL2 from each other.

The first detection electrode 4*a* is conductively connected to the first detection conductive portion 7*a* via the conductive bonding material 91. The second detection electrode 4*b* is conductively connected to the second detection conductive portion 7*b* via the conductive bonding material 91.

The wiring 5 is assembled at the element body 10, and uses a metal such as aluminum (Al) as a main component. In this embodiment, the wiring 5 includes a first wiring 51, a second wiring 52, a third wiring 53, a fourth wiring 54, a fifth wiring 55, a first detection wiring 5*a* and a second detection wiring 5*b*. In addition, in FIG. 3 to FIG. 8, the wiring 5 is schematically depicted.

The first wiring 51 is electrically disposed between the first electrode 41 and the first detection electrode 4*a*. In the example shown in the drawings, the first wiring 51 is connected to the first electrode 41 and the switch unit 6. The expression that the first wiring 51 is electrically disposed between the first electrode 41 and the first detection electrode 4*a* is not limited to a configuration of these direct connections, but can also be a configuration conducted via other constituting elements, and the same applies to the description below.

The second wiring 52 is electrically disposed between the second electrode 42 and the third electrode 43. In the example shown in the drawings, the second wiring 52 is connected to the second electrode 42 and the fifth electrode 45.

The third wiring 53 is electrically disposed between the fourth electrode 44 and the second detection electrode 4*b*. In the example shown in the drawings, the third wiring 53 is connected to the eighth electrode 48 and the switch unit 6.

The fourth wiring 54 is electrically disposed between the third electrode 43 and the sixth electrode 46. In the example shown in the drawings, the fourth wiring 54 is connected to the third electrode 43 and the sixth electrode 46.

The fifth wiring 55 is electrically disposed between the fourth electrode 44 and the seventh electrode 47. In the example shown in the drawings, the fifth wiring 55 is connected to the fourth electrode 44 and the seventh electrode 47.

The first detection wiring 5*a* is electrically disposed between the first electrode 41 and the first detection electrode 4*a*. In the example shown in the drawings, the first detection wiring 5*a* is connected to the switch unit 6 and the first detection electrode 4*a*.

The second detection wiring 5*b* is electrically disposed between the fourth electrode 44 and the second detection electrode 4*b*. In the example shown in the drawings, the second detection wiring 5*b* is connected to the switch unit 6 and the second detection electrode 4*b*.

In the semiconductor device A1, a conduction path EP between the first detection electrode 4*a* and the second detection electrode 4*b* sequentially includes the first wiring 51, the first electrode 41, the first conductive portion 71, the second electrode 42, the second wiring 52, the third electrode 43, the second conductive portion 72, the fourth electrode 44 and the third wiring 53. Thus, in this embodiment, the conduction path EP becomes a configuration that sequentially includes the first wiring 51, the first electrode 41, the first conductive portion 71, the second electrode 42, the second wiring 52, the fifth electrode 45, the third conductive portion 73, the sixth electrode 46, the fourth wiring 54, the third electrode 43, the second conductive portion 72, the fourth electrode 44, the fifth wiring 55, the seventh electrode 47, the fourth conductive portion 74, the eighth electrode 48 and the third wiring 53.

The switch unit 6 opens and closes conduction of the conduction path EP. The switch unit 6, for example, is formed by a switch circuit assembled at the element body 10. The switch unit 6 of this embodiment includes a first switch element 61 and a second switch element 62. The first switch element 61 and the second switch element 62 control open and close operations by, for example, inputting a predetermined control signal to any one of the multiple external electrodes 8.

The first switch element 61 is electrically disposed between the first wiring 51 and the first detection electrode 4*a*. When the first switch element 61 is turned off, the first wiring 51 is conducted with the first detection electrode 4*a*; when the first switch element 61 is turned on, the first wiring 51 is insulated from the first detection electrode 4*a*.

The second switch element 62 is electrically disposed between the third wiring 53 and the second detection electrode 4*b*. When the second switch element 62 is turned off, the third wiring 53 is conducted with the second detection electrode 4*b*; when the second switch element 62 is turned on, the third wiring 53 is insulated from the second detection electrode 4*b*.

[Sealing Resin 3]

The sealing resin 3 is disposed on the side z1 of the support body 2 in the z direction, and covers the semiconductor element 1. The sealing resin 3 is formed of, for example, black epoxy. In the example shown in the drawings, the sealing resin 3 has a rectangular shape in a same size as that of the support body 2 when observed in the z direction.

Next, the effects of the semiconductor device A1 are described below.

FIG. 9 shows the semiconductor device A1 when the semiconductor element 1 is accidentally tilted about an axis extending along the y direction while the semiconductor element 1 is flip-chip mounted on the support body 2. In the case shown in the drawings, the part (the second side 12) of the semiconductor element 1 on the side x2 in the x direction is away from the support body 2 on the side z1 in the z direction. Thus, among the multiple electrodes 4, the electrode 4 closer to the side x2 in the x direction is farther away from the support body 2. In the part where a distance between the electrode 4 and the support body 2 becomes a distance that the conductive bonding material 91 cannot be used for connection, the electrode 4 and the support body 2 are not appropriately conductively connected. In the drawing, the fourth electrodes 4 are not conductively connected to the second conductive portion 72.

In this case, the first switch element 61 and the second switch element 62 of the switch unit 6 are turned off, and the first external electrode 8*a* and the second external electrode 8*b* are used to perform conduction detection processing from an exterior of the semiconductor device A1. Since the fourth electrodes 4 are not conductively connected to the second conductive portion 72, the conduction of the conduction path EP is obstructed. Thus, when a result of the conduction detection processing using the first external electrode 8*a* and the second external electrode 8*b* indicates non-conduction, it can be determined that the conductive connection of any one of the first electrode 41 to the eighth electrode 48 in the conduction path EP is insufficient.

The description is not limited to the condition shown in the drawings. In a case where the semiconductor element 1 is tilted on an opposite side to that shown in the drawing about the axis extending along the y direction, the conduction connection of the first electrode 41 and the second electrode 42 is insufficient. Moreover, when a case where the semiconductor element 1 is tilted about the axis extending along the x direction, the conduction connection of the fifth electrode layer 45 and the sixth electrode 46 or the conduction connection of the seventh electrode 47 and the eighth electrode 48 is insufficient. The conduction detection processing of the conduction path EP using the first external electrode 8*a* and the second external electrode 8*b* can be used to detect these insufficient conduction connections. Thus, flip-chip mounting failures can be more appropriately detected.

By configuring the first conductive portion 71 and the second conductive portion 72 on opposite sides of the first central line CL1, an insufficient conduction connection when the semiconductor element 1 is tilted about the axis extending along the y direction can be detected. The configuration in which the first electrode 41 and the second electrode 42 are arranged along the first side 11, and the third electrode 43 and the fourth electrode 44 are arranged along the second side 12, is appropriate for detecting an insufficient conduction connection when the semiconductor element 1 is tilted about the axis extending along the y direction.

By configuring the third conductive portion 73 and the fourth conductive portion 74 on opposite sides of the second central line CL2, an insufficient conduction connection when the semiconductor element 1 is tilted about the axis extending along the x direction can be detected. The configuration in which the fourth electrode 44 and the fifth electrode 45 are arranged along the third side 13, and the seventh electrode 47 and the eighth electrode 48 are arranged along the fourth side 14, is appropriate for detecting an insufficient conduction connection when the semiconductor element 1 is tilted about the axis extending along the x direction.

With the switch unit 6, when the semiconductor element 1 is appropriately flip-chip mounted on the support body 2 and the conduction path EP is sufficiently conducted, accidental short-circuitry can be prevented by connecting a part of a wiring pattern (not shown) to the first external electrode 8*a* and the second external electrode 8*b*.

FIG. 10 to FIG. 15 show other embodiments of the present disclosure. Moreover, in these drawings, elements that are the same or similar to those of the embodiment above are assigned with the same denotations or numerals. Moreover, the configurations of various parts of the variation examples and the embodiments can be implemented in combination, given that they are not technically contradictory.

First Variation Example of First Embodiment

Figure 10:
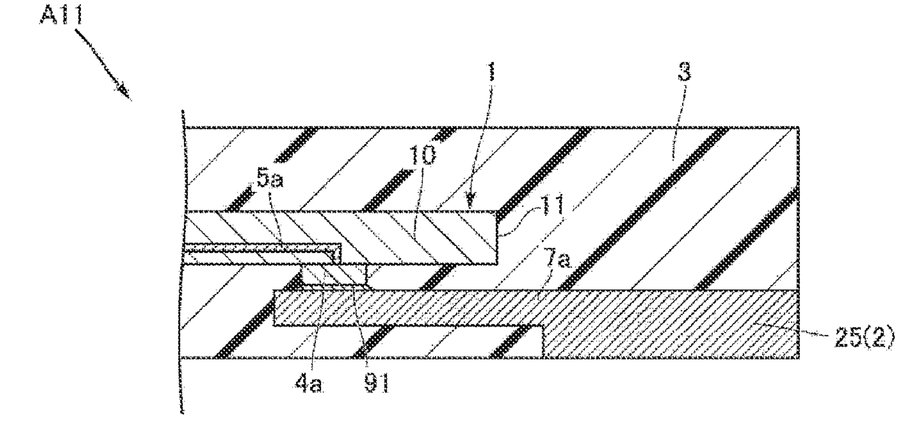
FIG. 10 is a partial enlarged cross-sectional view of a first variation example of a semiconductor device according to the first embodiment of the present disclosure.
Figure 10:
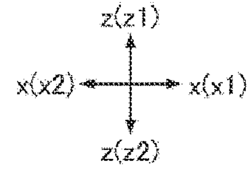
Figure 11:
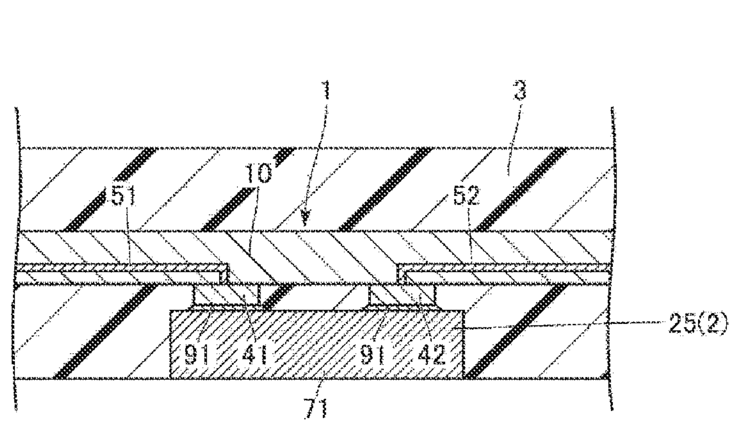
FIG. 11 is a partial enlarged cross-sectional view of the first variation example of a semiconductor device according to the first embodiment of the present disclosure.
Figure 11:
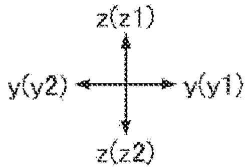

FIG. 10 and FIG. 11 show a first variation example of the semiconductor device A1. In a semiconductor device A11 of this variation example, the configuration of the support body 2 is different from the embodiment above. The support body 2 of this variation example is formed by multiple conductive wires 25.

The multiple conductive wires 25 are formed of, for example, a metal such as copper. Any one of the multiple conductive wires 25 forms the first conductive portion 71, the second conductive portion 72, the third conductive portion 73, the fourth conductive portion 74, the first detection conductive portion 7*a* and the second detection conductive portion 7*b*. The first detection conductive portion 7*a* shown in FIG. 10 is exposed from the sealing resin 3 toward the side x1 in the x direction and the side z2 in the z direction. Such semiconductor device A11 is referred to as, for example, a package structure in a quad flat non-leaded (QFN) package.

As shown in FIG. 11, the first conductive portion 71 is exposed from the sealing resin 3 toward the side z2 in the z direction. However, the first conductive portion 71 is not necessarily exposed from the sealing resin 3.

According to this variation example, flip-chip mounting failures can also be more appropriately detected. Moreover, as understood in accordance with this variation example, the semiconductor device of the present disclosure is not defined to have a specific package structure.

Second Embodiment

Figure 12:
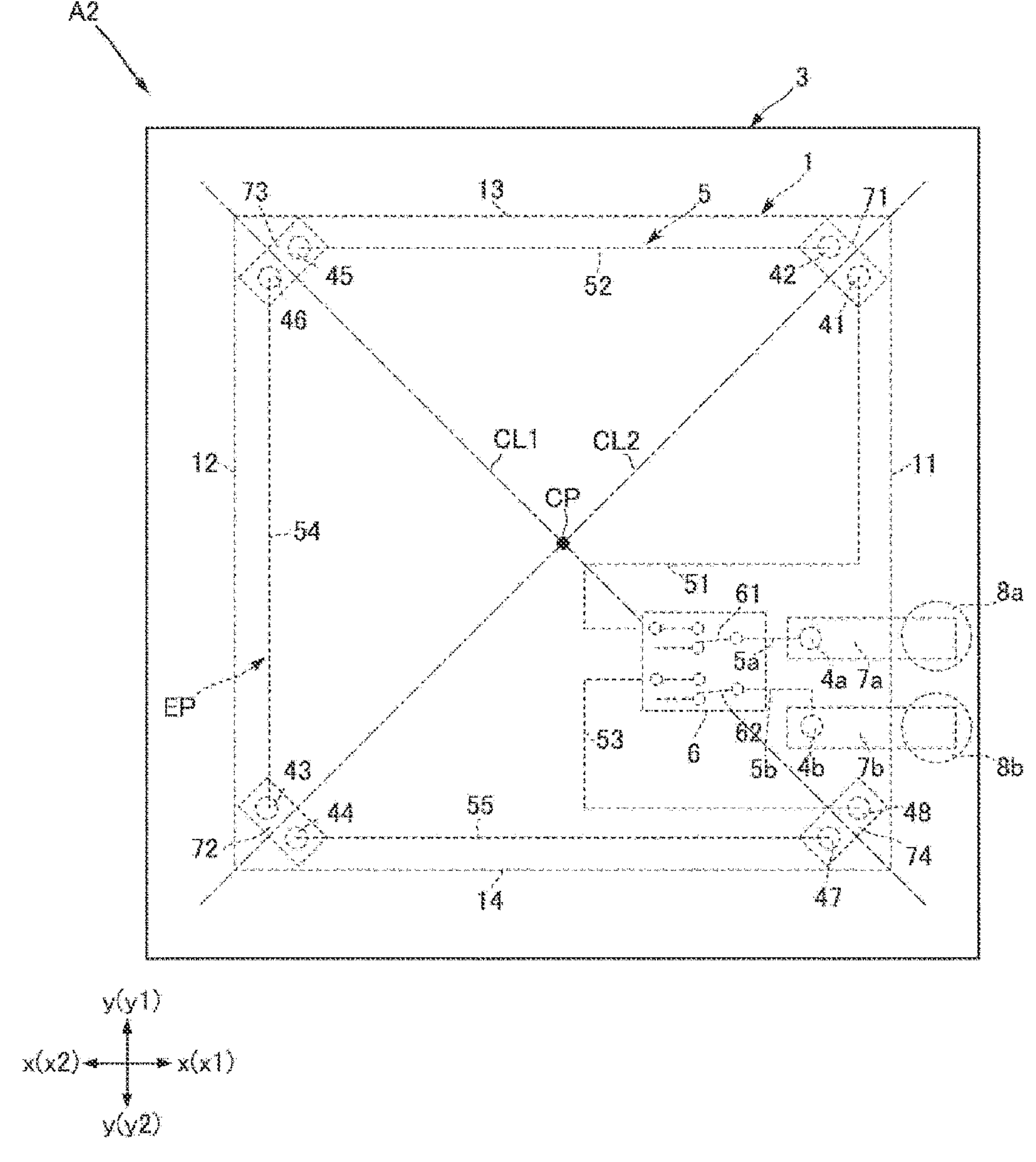
FIG. 12 is a plan view of a semiconductor device according to a second embodiment of the present disclosure.

FIG. 12 shows a semiconductor device according to a second embodiment of the present disclosure. In a semiconductor device A2 of this embodiment, the configurations of the first conductive portion 71 to the fourth conductive portion 74 and the first electrode 41 to the eighth electrode 48 are different from the embodiment above.

In this embodiment, the first conductive portion 71 to the fourth conductive portion 74 are disposed at positions corresponding to four corners of the semiconductor element 1. That is to say, the first conductive portion 71 is disposed at a corner at which the first side 11 intersects the third side 13, the second conductive portion 72 is disposed at a corner at which the second side 12 intersects the fourth side 14, the third conductive portion 73 is disposed at a corner at which the second side 12 intersects the third side 13, and the fourth conductive portion 74 is disposed at a corner at which the first side 11 intersects the fourth side 14. The first electrode 41 to the eighth electrode 48 are disposed at positions respectively overlapping the first conductive portion 71 to the fourth conductive portion 74 individually conductively connected when observed from the z direction.

The first central line CL1 and the second central line CL2 of this embodiment are tilted by approximately 45° relative to the x direction and the y direction. In this embodiment, the extension direction of the first central line CL1 is the first direction in the present disclosure, and the extension direction of the second central line CL2 is the second direction in the present disclosure.

According to this embodiment, flip-chip mounting failures can also be more appropriately detected. Moreover, in this embodiment, the first conductive portion 71 to the fourth conductive portion 74 are disposed at positions corresponding to four corners of the semiconductor element 1. Such configuration is suitable for a case where the conduction connections at the four corners of the semiconductor element 1 may become insufficient due to the tilted semiconductor element 1.

Third Embodiment

Figure 13:
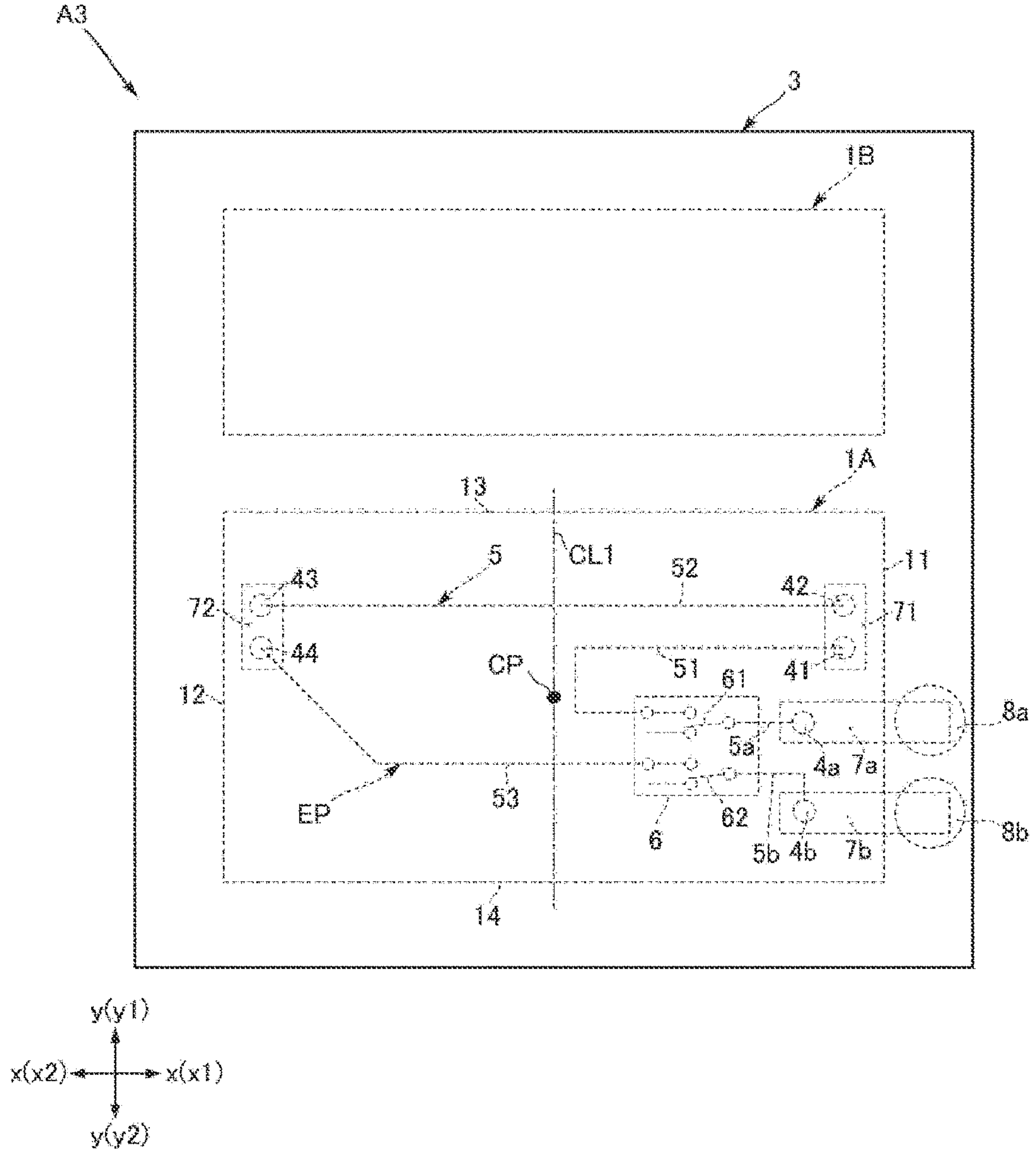
FIG. 13 is a plan view of a semiconductor device according to a third embodiment of the present disclosure.

FIG. 13 shows a semiconductor device according to a third embodiment of the present disclosure. A semiconductor device A3 of this embodiment includes a semiconductor element 1A and a semiconductor element 1B. The semiconductor element 1A and the semiconductor element 1B are mounted on the same support body 2. The semiconductor element 1A is flip-chip mounted on the support body 2. The semiconductor element 1A has, for example, a rectangular shape with the x direction as a lengthwise direction.

The multiple electrodes 4 include the first electrode 41 to the fourth electrode 44 as well as the first detection electrode 4*a* and the second detection electrode 4*b*, but exclude the fifth electrode 45 to the eighth electrode 48 of the embodiment above. Moreover, the support body 2 includes the first conductive portion 71 and the second conductive portion 72 as well as the first detection conductive portion 7*a* and the second detection conductive portion 7*b*, but excludes the third conductive portion 73 and the fourth conductive portion 74 of the embodiment above.

In this embodiment, the first conductive portion 71 and the second conductive portion 72 are also arranged on opposite sides of the first central line CL1. The first conductive portion 71 is arranged along the first side 11. The second conductive portion 72 is arranged along the second side 12.

According to this embodiment, flip-chip mounting failures can also be more appropriately detected. Moreover, as understood in accordance with this embodiment, according to the configuration such as the shape of the semiconductor element 1A, a configuration without the fifth electrode 45 to the eighth electrode 48 or the third conductive portion 73 and the fourth conductive portion 74 can also be implemented. When the semiconductor element 1A has a rectangular shape with the x direction as a lengthwise direction, the semiconductor element 1A is likely tilted about an axis extending in the y direction. According to the semiconductor device A3, flip-chip mounting failures caused by such tilting can be more appropriately detected.

Fourth Embodiment

Figure 14:
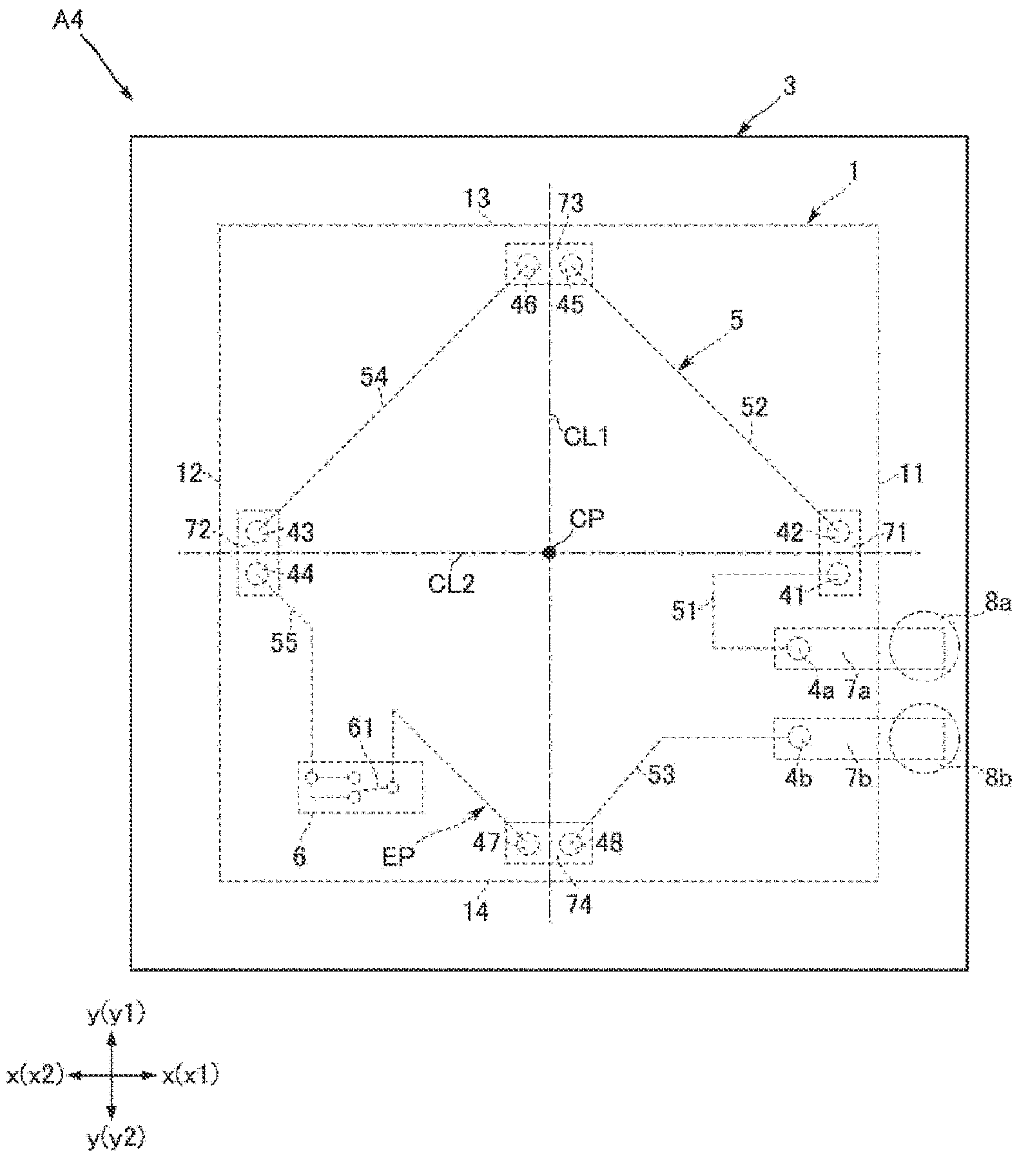
FIG. 14 is a plan view of a semiconductor device according to a fourth embodiment of the present disclosure.

FIG. 14 shows a semiconductor device according to a fourth embodiment of the present disclosure. In a semiconductor device A4 of this embodiment, the configuration of the switch unit 6 is different from the semiconductor device A1.

The switch unit 6 of this embodiment is configured to open and close the conduction of the fifth wiring 55. More specifically, the switch unit 6 only includes the first switch element 61. The first switch element 61 is connected in series to other parts of the fifth wiring 55. By turning on and turning off the first switch element 61, the conduction of the conduction path EP is opened and closed.

According to this embodiment, flip-chip mounting failures can also be more appropriately detected. Moreover, as understood in accordance with this embodiment, if the switch unit 6 is configured to open and close the conduction of the conduction path EP, it is not limited to being disposed at any position on the conduction path EP.

Fifth Embodiment

Figure 15:
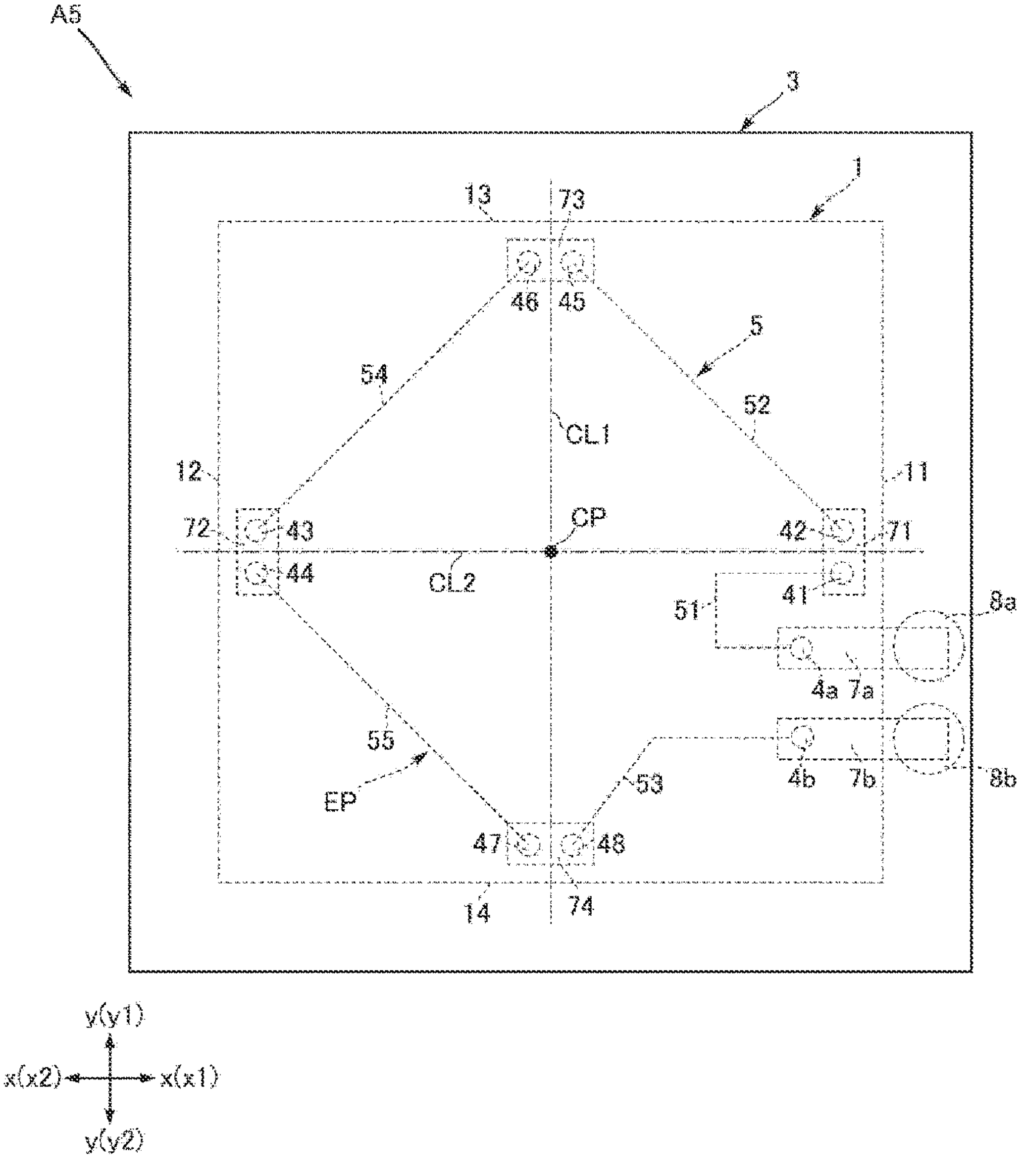
FIG. 15 is a plan view of a semiconductor device according to a fifth embodiment of the present disclosure.

FIG. 15 shows a semiconductor device according to a fifth embodiment of the present disclosure. A semiconductor device A5 of this embodiment does not include the switch unit 6, and the remaining configuration is the same as the semiconductor device A1.

According to this embodiment, flip-chip mounting failures can also be more appropriately detected. Moreover, as understood in accordance with this embodiment, even without the switch unit 6, another control unit (not shown) installed at such as a circuit substrate (not shown) for mounting the semiconductor device A5 can also be used to perform and stop the control for conduction detection of the conduction path EP using the first external electrode 8*a* and the second external electrode 8*b*.

The semiconductor device of the present disclosure is not limited to the embodiments described above. Various design modifications may be made as desired to the specific structures of the components of the semiconductor device of the present disclosure.

[Note 1]

A semiconductor device, comprising:

a semiconductor element, having a plurality of electrodes; and a support body, in which the plurality of electrodes are bonded by a plurality of conductive bonding materials, wherein the support body includes a first conductive portion and a second conductive portion, the plurality of electrodes include a first electrode and a second electrode conductively connected to the first conductive portion, a third electrode and a fourth electrode conductively connected to the second conductive portion, and a first detection electrode and a second detection electrode, the semiconductor element further includes a first wiring, a second wiring and a third wiring, the first wiring is electrically disposed between the first electrode and the first detection electrode, the second wiring is electrically disposed between the second electrode and the third electrode, the third wiring is electrically disposed between the fourth electrode and the second detection electrode, and a conduction path is configured to sequentially include the first wiring, the first electrode, the first conductive portion, the second electrode, the second wiring, the third electrode, the second conductive portion, the fourth electrode and the third wiring between the first detection electrode and the second detection electrode.

[Note 2]

The semiconductor device according to Note 1, wherein the semiconductor element further includes a switch unit configured to open and close conduction of the conduction path.

[Note 3]

The semiconductor device according to Note 2, wherein the semiconductor element has a rectangular shape with first and second sides that are in parallel to each other, and third and fourth sides that are in parallel to each other.

[Note 4]

The semiconductor device according to Note 3, wherein the first conductive portion and the second conductive portion are arranged on opposite sides of a first central line passing through a center of the semiconductor element and extending along a first direction.

[Note 5]

The semiconductor device according to Note 4, wherein the first electrode and the second electrode are arranged along the first side, and the third electrode and the fourth electrode are arranged along the second side.

[Note 6]

The semiconductor device according to Note 4 or 5, wherein the first wiring and the second wiring are longer than the first conductive portion and the second conductive portion.

[Note 7]

The semiconductor device according to any one of Notes 4 to 6, wherein the support body further includes a third conductive portion and a fourth conductive portion, the semiconductor element further includes a fourth wiring and a fifth wiring, the plurality of electrodes further include a fifth electrode and a sixth electrode conductively connected to the third conductive portion, and a seventh electrode and an eighth electrode conductively connected to the fourth conductive portion, the second wiring is electrically disposed between the first electrode and the fifth electrode, the third wiring is electrically disposed between the eighth electrode and the second detection electrode, the fourth wiring is electrically disposed between the third electrode and the sixth electrode, the fifth wiring is electrically disposed between the fourth electrode and the seventh electrode, and the conduction path further includes the third conductive portion, the fourth conductive portion, the fifth to the eighth electrodes, the fourth wiring and the fifth wiring.

[Note 8]

The semiconductor device according to Note 7, wherein the third conductive portion and the fourth conductive portion are arranged on opposite sides of a second central line passing through the center of the semiconductor element and extending along a second direction perpendicular to the first direction.

[Note 9]

The semiconductor device according to Note 8, wherein the fifth electrode and the sixth electrode are arranged along the third side, and the seventh electrode and the eighth electrode are arranged along the second side.

[Note 10]

The semiconductor device according to Note 8 or 9, wherein the fourth wiring and the fifth wiring are longer than the third conductive portion and the fourth conductive portion.

[Note 11]

The semiconductor device according to Note 10, wherein the fifth to the eighth electrodes are located between the first and second electrodes and the third and fourth electrodes along the first direction.

[Note 12]

The semiconductor device according to Note 11, wherein the first to fourth electrodes are located between the fifth and sixth electrodes and the seventh and eighth electrodes in the second direction.

[Note 13]

The semiconductor device according to Note 12, wherein the first central line intersects the third conductive portion and the fourth conductive portion.

[Note 14]

The semiconductor device according to Note 13, wherein the second central line intersects the first conductive portion and the second conductive portion.

[Note 15]

The semiconductor device according to any one of Notes 7 to 14, wherein the switch unit includes a first switch element electrically disposed between the first electrode and the first detection electrode.

[Note 16]

The semiconductor device according to Note 15, wherein the switch unit includes a second switch element electrically disposed between the eighth electrode and the second detection electrode.

[Note 17]

The semiconductor device according to any one of Notes 1 to 16, wherein the support body further includes a first external electrode electrically connected to the first detection electrode, and a second external electrode electrically connected to the second detection electrode.

The invention claimed is:

1. A semiconductor device, comprising:

a semiconductor element, having a plurality of electrodes; and a support body, in which the plurality of electrodes are bonded by a plurality of conductive bonding materials, wherein the support body includes a first conductive portion and a second conductive portion, the plurality of electrodes include:

a first electrode and a second electrode, conductively connected to the first conductive portion;

a third electrode and a fourth electrode, conductively connected to the second conductive portion; and a first detection electrode and a second detection electrode, the semiconductor element further includes a first wiring, a second wiring and a third wiring, the first wiring is electrically connected between the first electrode and the first detection electrode, the second wiring is electrically connected between the second electrode and the third electrode, the third wiring is electrically connected between the fourth electrode and the second detection electrode, and a conduction path is configured to sequentially include the first wiring, the first electrode, the first conductive portion, the second electrode, the second wiring, the third electrode, the second conductive portion, the fourth electrode and the third wiring between the first detection electrode and the second detection electrode.

2. The semiconductor device of claim 1, wherein the semiconductor element further includes a switch unit configured to open and close conduction of the conduction path.

3. The semiconductor device of claim 2, wherein the semiconductor element has a rectangular shape with first and second sides that are in parallel to each other, and third and fourth sides that are in parallel to each other.

4. The semiconductor device of claim 3, wherein the first conductive portion and the second conductive portion are arranged on opposite sides of a first central line passing through a center of the semiconductor element and extending along a first direction.

5. The semiconductor device of claim 4, wherein the first electrode and the second electrode are arranged along the first side, and the third electrode and the fourth electrode are arranged along the second side.

6. The semiconductor device of claim 4, wherein the first wiring and the second wiring are longer than the first conductive portion and the second conductive portion.

7. The semiconductor device of claim 5, wherein the first wiring and the second wiring are longer than the first conductive portion and the second conductive portion.

8. The semiconductor device of claim 4, wherein the support body further includes a third conductive portion and a fourth conductive portion, the semiconductor element further includes a fourth wiring and a fifth wiring, the plurality of electrodes further include a fifth electrode and a sixth electrode conductively connected to the third conductive portion, and a seventh electrode and an eighth electrode conductively connected to the fourth conductive portion, the second wiring is electrically connected between the first electrode and the fifth electrode, the third wiring is electrically connected between the eighth electrode and the second detection electrode, the fourth wiring is electrically connected between the third electrode and the sixth electrode, the fifth wiring is electrically connected between the fourth electrode and the seventh electrode, and the conduction path further includes the third conductive portion, the fourth conductive portion, the fifth to the eighth electrodes, the fourth wiring and the fifth wiring.

9. The semiconductor device of claim 5, wherein the support body further includes a third conductive portion and a fourth conductive portion, the semiconductor element further includes a fourth wiring and a fifth wiring, the plurality of electrodes further include a fifth electrode and a sixth electrode conductively connected to the third conductive portion, and a seventh electrode and an eighth electrode conductively connected to the fourth conductive portion, the second wiring is electrically connected between the first electrode and the fifth electrode, the third wiring is electrically connected between the eighth electrode and the second detection electrode, the fourth wiring is electrically connected between the third electrode and the sixth electrode, the fifth wiring is electrically connected between the fourth electrode and the seventh electrode, and the conduction path further includes the third conductive portion, the fourth conductive portion, the fifth to the eighth electrodes, the fourth wiring and the fifth wiring.

10. The semiconductor device of claim 6, wherein the support body further includes a third conductive portion and a fourth conductive portion, the semiconductor element further includes a fourth wiring and a fifth wiring, the plurality of electrodes further include a fifth electrode and a sixth electrode conductively connected to the third conductive portion, and a seventh electrode and an eighth electrode conductively connected to the fourth conductive portion, the second wiring is electrically connected between the first electrode and the fifth electrode, the third wiring is electrically connected between the eighth electrode and the second detection electrode, the fourth wiring is electrically connected between the third electrode and the sixth electrode, the fifth wiring is electrically connected between the fourth electrode and the seventh electrode, and the conduction path further includes the third conductive portion, the fourth conductive portion, the fifth to the eighth electrodes, the fourth wiring and the fifth wiring.

11. The semiconductor device of claim 8, wherein the third conductive portion and the fourth conductive portion are arranged on opposite sides of a second central line passing through the center of the semiconductor element and extending along a second direction perpendicular to the first direction.

12. The semiconductor device of claim 11, wherein the fifth electrode and the sixth electrode are arranged along the third side, and the seventh electrode and the eighth electrode are arranged along the second side.

13. The semiconductor device of claim 11, wherein the fourth wiring and the fifth wiring are longer than the third conductive portion and the fourth conductive portion.

14. The semiconductor device of claim 13, wherein the fifth to the eighth electrodes are located between the first and second electrodes and the third and fourth electrodes along the first direction.

15. The semiconductor device of claim 14, wherein the first to fourth electrodes are located between the fifth and sixth electrodes and the seventh and eighth electrodes in the second direction.

16. The semiconductor device of claim 15, wherein the first central line intersects the third conductive portion and the fourth conductive portion.

17. The semiconductor device of claim 16, wherein the second central line intersects the first conductive portion and the second conductive portion.

18. The semiconductor device of claim 8, wherein the switch unit includes a first switch element electrically connected between the first electrode and the first detection electrode.

19. The semiconductor device of claim 18, wherein the switch unit includes a second switch element electrically connected between the eighth electrode and the second detection electrode.

20. The semiconductor device of claim 1, wherein the support body further includes:

a first external electrode, electrically connected to the first detection electrode; and a second external electrode, electrically connected to the second detection electrode.

* * * * *